United States Patent
Koyama (10) Patent No.: US 7,605,354 B2
(45) Date of Patent: Oct. 20, 2009

(54) COLOR SENSOR, PRODUCTION METHOD THEREOF, SENSOR, AND ELECTRONICS DEVICE

(75) Inventor: Junichiro Koyama, Nara (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 93 days.

(21) Appl. No.: 11/797,313

(22) Filed: May 2, 2007

(65) Prior Publication Data
US 2007/0268387 A1 Nov. 22, 2007

(30) Foreign Application Priority Data
May 19, 2006 (JP) .............................. 2006-140927

(51) Int. Cl.
*H01L 27/00* (2006.01)
*H04N 9/04* (2006.01)

(52) U.S. Cl. ................. 250/208.1; 250/226; 250/214.1; 348/273

(58) Field of Classification Search ............... 250/208.1, 250/214.1, 226; 348/273, 274, 277, 290; 257/294, 432
See application file for complete search history.

(56) References Cited

U.S. PATENT DOCUMENTS

| 2005/0205765 A1 | 9/2005 | Tan et al. |
| 2005/0258501 A1 | 11/2005 | Natsuaki et al. |
| 2007/0018264 A1* | 1/2007 | Rhodes et al. .............. 257/432 |

FOREIGN PATENT DOCUMENTS

| JP | 6-77507 A | 3/1994 |
| JP | 06-224463 | 8/1994 |
| JP | 06-237005 | 8/1994 |
| JP | 2000-223734 A | 8/2000 |
| JP | 2004-87979 | 3/2004 |
| JP | 2005-294825 A | 10/2005 |

* cited by examiner

*Primary Examiner*—Kevin Pyo
(74) *Attorney, Agent, or Firm*—Birch, Stewart, Kolasch & Birch, LLP (57) ABSTRACT

A color sensor of the present invention is arranged such that (i) an interference filter is provided directly above light receiving elements so as to transmit incoming light having a predetermined wavelength of the incoming light, and color filters are provided directly on the interference filter, or (ii) the color filters are provided directly above the light receiving element, and the interference filter is provided directly on the color filters so as to transmit incoming light having a predetermined wavelength of the incoming light.

8 Claims, 3 Drawing Sheets

PRIOR ART

COLOR SENSOR, PRODUCTION METHOD THEREOF, SENSOR, AND ELECTRONICS DEVICE

This Nonprovisional application claims priority under 35 U.S.C. § 119(a) on Patent Application No. 140927/2006 filed in Japan on May 19, 2006, the entire contents of which are hereby incorporated by reference.

FIELD OF THE INVENTION

The present invention relates to a color sensor, which is used for, for example, (i) a backlight of a liquid crystal display, and (ii) an image scanning device that performs (a) color adjustment of a color copying machine and a color printer, (b) discriminant analysis of paper money, or the like, a production method of the color sensor, a sensor including the color sensor, and an electronics device including the color sensor.

BACKGROUND OF THE INVENTION

Conventionally, a mercury lamp has been generally used as a backlight of a liquid crystal display. However, it is being examined due to improved luminous efficiency of an LED, an environmental problem, or the like, to change the mercury lamp to an LED light source. Particularly in a case of a liquid crystal television, a backlight that employs LEDs of three colors (red, green, and blue) has been developed because various colors can be realized with the LEDs. As a result of the development, a color sensor is used for adjustment of white balance.

The color sensor is also generally used as an image scanning device that performs (i) color adjustment of a color copying machine and a color printer, (ii) discriminant analysis of paper money, or the like.

Figure 4:
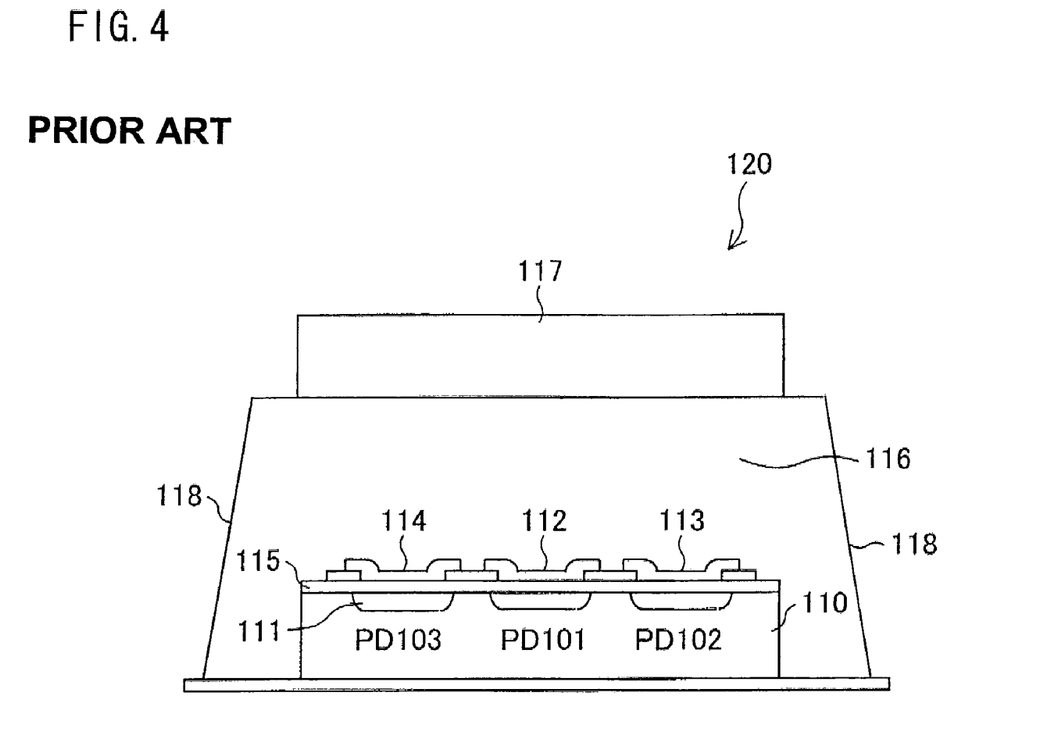
FIG. 4 is a cross sectional view illustrating a substantial part in an arrangement of a conventional color sensor.

FIG. 4 illustrates an arrangement of a color sensor 120 that is generally used.

In the color sensor 120, three P-type anode layers 111 are formed below one surface of an N-type substrate 110. Moreover, in the color sensor 120, three silicon photodiodes PD101, PD102, and PD103 are formed so as to share the N-type substrate as a common cathode layer.

In the color sensor 120, color filters 112, 113, and 114 are also formed above respective light receiving sections of the silicon photodiodes PD101, PD102, and PD103. The color filters 112, 113, and 114 together with the silicon photodiodes PD101, PD102, and PD103 are subjected to resin molding using a transparent resin 116, and a visible light transmitting filter 117 is adhered onto the transparent resin 116.

When light enters the color sensor 120, only visible light enters the color filter 112, 113, and 114 through the visible light transmitting filter 117.

Because the color filter 112 transmits only red light and infrared light, only red light enters the photodiode PD101.

Because the color filter 113 transmits only green light, only green light enters the photodiode PD102.

Moreover, because the color filter 114 transmits only blue light and ultraviolet light, only blue light enters the photodiode PD103.

Accordingly, color analysis of incoming light is possible by carrying out comparison between photoelectric currents which are outputted from the three photodiodes PD101, PD102, and PD103.

Japanese Unexamined Patent Publication No. 77507/1994 (Tokukaihei 6-77507) (published on Mar. 18, 1994) discloses a light receiving element obtained by forming an infrared cutting filter on a light receiving substrate that performs photoelectric conversion. The infrared cutting filter is a multilayer film composed of (i) a layer having a low refraction index and (ii) a layer having a high refraction index. Japanese Unexamined Patent Publication No. 223734/2000 (Tokukai 2000-223734) (published on Aug. 11, 2000) discloses a color sensor that identifies a wavelength of visible light on the basis of a bias condition.

However, in a case of the conventional color sensor 120, as illustrated in FIG. 4, which is arranged such that the visible light transmitting filter 117 is adhered onto the transparent resin 116, light does not necessarily enter the color sensor 120 through the visible light transmitting filter 117. However, light also enters the color sensor 120 from a side surface 118 of the transparent resin 116 or the like.

In such a case, light in a region other than a visible region enters the color filters 112, 113, and 114. Consequently, for example, because the color filter 112 transmits infrared light, the infrared light enters the photodiode PD101.

Although a silicon photodiode is generally very sensitive to near infrared light having a wavelength in a range from 700 nm to 900 nm, eyes of a human being cannot see infrared light.

Accordingly, a photoelectric current generated by near infrared light becomes a noise component in color analysis and interferes with a precise color analysis.

Moreover, in the conventional arrangement, the visible light transmitting filter 117 is adhered onto the transparent resin 116. This arrangement causes a problem such that the visible light transmitting filter 117 easily comes off the transparent resin 116 by mechanical or thermal stress.

Japanese Unexampled Patent Publication No. 77507/1994 (Tokukaihei 6-77507) (published on Mar. 18, 1994) neither describes nor suggests anything about a color sensor including both a color filter and an interference filter.

Japanese Unexamined Patent Publication No. 223734/2000 (Tokukai 2000-223734) (published on Aug. 11, 2000) neither describes nor suggests anything about the light receiving element provided with a combination of an interference filter and a color filter, which combination performs a color identifying function.

SUMMARY OF THE INVENTION

An object of the present invention is to provide a color sensor, which is capable of (i) preventing a photoelectric current from being generated by near infrared light and infrared light and (ii) performing a precise color analysis, a production method of the color sensor, a sensor including the color sensor, and an electronics device including the color sensor.

In order to solve the problem mentioned above, according to the present invention, a color sensor including: a plurality of color filters, provided side by side, transmitting incident light; and light receiving elements, respectively corresponding to the color filters, each converting the incident light into an electrical signal, the color sensor further includes: an interference filter, provided directly above the light receiving elements, transmitting light having a predetermined wavelength of the incident light; and the color filters being provided directly on the interference filter.

According to this arrangement, the interference filter is provided adjacent to the color filter. Accordingly, immediately after light passes through the color filter, the light passes through the interference filter. This makes it possible to prevent a photoelectric current, which is caused by incoming near infrared light and infrared light and interferes with color analysis. As a result, it becomes possible to carry out a precise color analysis of incoming light, which color analysis is carried out with less noise component caused by the near infrared light.

As a result, this makes it possible to provide a color sensor which is capable of preventing a photoelectric current caused by near infrared light and infrared light and carrying out a precise color analysis.

In order to solve the problem mentioned above, according to the present invention, a color sensor including: a plurality of color filters, provided side by side, transmitting incident light; and light receiving elements, respectively corresponding to the color filters, each converting the incident light into an electrical signal, the color sensor further includes: an interference filter, provided directly on the color filters, transmitting light having a predetermined wavelength of the incident light; and the color filters being provided directly above the light receiving element.

According to this arrangement, the color filter is provided adjacent to the interference filter. Accordingly, immediately after light passes through the interference filter, the light passes through the color filter. This makes it possible to prevent a photoelectric current which is caused by incoming near infrared light and interferes with color analysis. As a result, it becomes possible to carry out a precise color analysis of incoming light, which color analysis is carried out with less noise component caused by the near infrared light.

As a result, this makes it possible to provide a color sensor which is capable of preventing a photoelectric current caused by near infrared light and carrying out a precise color analysis.

In order to solve the problem mentioned above, according to the present invention, in a production method of a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter, a silicon oxide film is formed on a metal section of the light receiving element before formation of the interference filter.

This makes it possible to prevent corrosion of an electrode material such as aluminum, which corrosion may be caused by a developer or the like used in patterning the color filters.

A sensor of the present invention, in order to solve the problem mentioned above, includes a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter.

An electronics device of the present invention, in order to solve the problem mentioned above, includes a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter.

This makes it possible to provide a sensor and an electronics device that can prevent a photoelectric current caused by near infrared light and infrared light and carry out a precise color analysis.

For a fuller understanding of the nature and advantages of the invention, reference should be made to the ensuing detailed description taken in conjunction with the accompanying drawings.

BRIEF DESCRIPTION OF THE DRAWINGS

FIG. 1 illustrates one embodiment of a color sensor of the present invention.

FIG. 3($a$) is a schematic diagram illustrating a depletion layer in an $N^-$ epitaxial layer of the color sensor in a case where the depletion layer is arranged to be thick in order to suppress influence of noise on the color sensor, which noise is produced by a sneak current.

FIG. 3($b$) is a schematic diagram illustrating a depletion layer in an $N^-$ epitaxial layer of the color sensor in a case where the color sensor is influenced by noise produced by a sneak current due to a thin depletion layer.

DESCRIPTION OF THE EMBODIMENTS

One embodiment of the present invention is explained below with reference to FIGS. 1 through 3.

Figure 1:
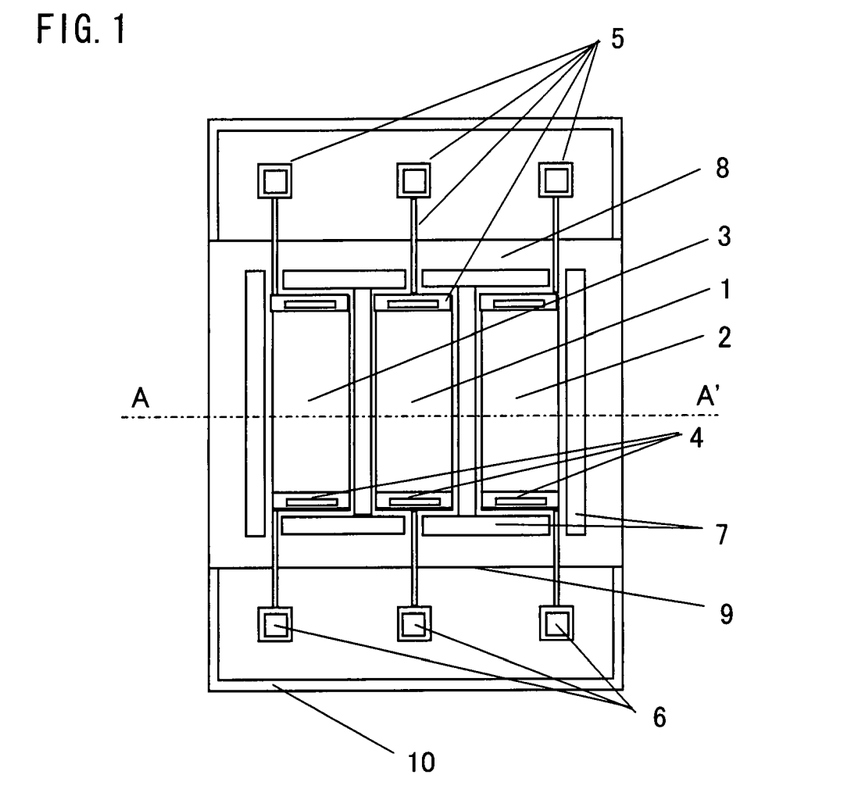
FIG. 1 is a plan view illustrating a substantial part in an arrangement of the color sensor.

FIG. 1 is a plan view illustrating a color sensor of the present embodiment.

Figure 2:
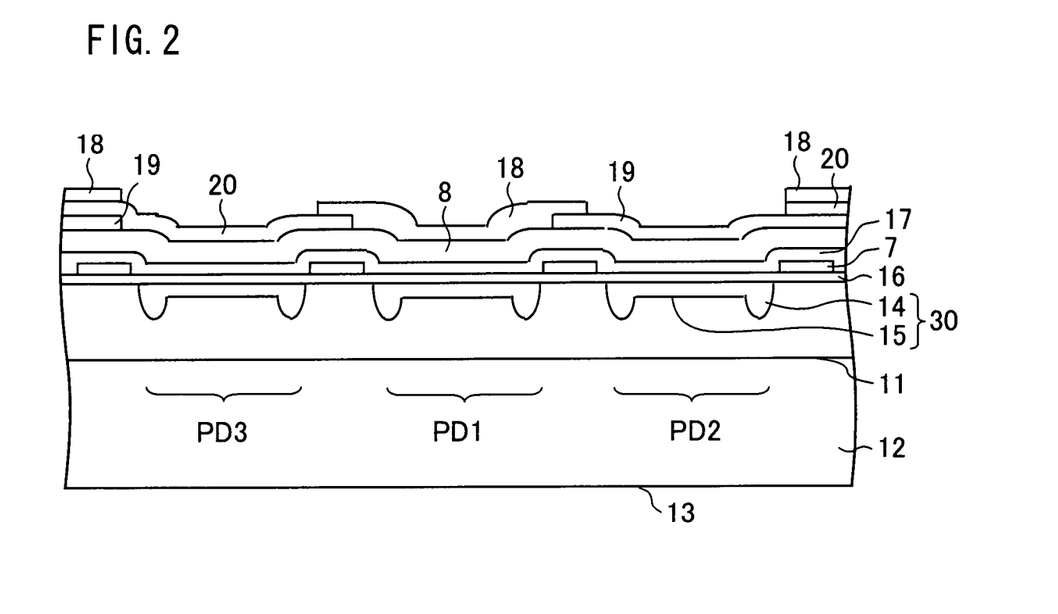
FIG. 2 is a cross sectional view taken along a line A-A' of FIG. 1.

FIG. 2 is a cross sectional view taken along a line A-A' of FIG. 1.

As illustrated in FIG. 2, the color sensor of the present embodiment includes a silicon epitaxial wafer in which an $N^-$ epitaxial layer 11 (serving as a first conductive layer) is formed, by using an epitaxial growth, on an $N^+$ substrate 12 (serving as a first conductive semiconductor substrate). The $N^-$ epitaxial layer 11 of the silicon epitaxial wafer includes a P-type anode layer 30 (serving as a second conductive layer). The P-type anode layer 30 is composed of a frame-like periphery section 14 and a center region 15.

Moreover, the color sensor includes three photodiodes PD1, PD2, and PD3 which are formed to be light receiving elements by the P-type anode layer 30, the $N^+$ substrate 12 (serving as a cathode shared by the photodiodes PD1, PD2, and PD3), and the $N^-$ epitaxial layer 11. The photodiodes PD1, PD2, and PD3 function as a first photodiode, a second photodiode, and a third photodiode of the present invention, respectively.

An interference filter 8 is formed so as to cover (i) a light receiving section 1 of the photodiode PD1, a light receiving section 2 of the photodiode PD2, and a light receiving section 3 of the photodiode PD3, and (ii) their peripheries.

According to the present embodiment, before formation of the interference filter 8, a silicon oxide film 17 is formed so as to be between (i) the interference filter 8 and (ii) metal electrodes 5 or light shielding metals 7. This arrangement is adopted because a crack occurs in the interference filter 8 when the interference filter 8 is directly formed on metal.

Moreover, the interference filter 8 has color filters 18, 19, and 20 formed thereon. The formation of the color filters 18, 19, and 20 are more specifically explained as follows: the color filter 18 is formed on the light receiving section 1; the color filter 19 is formed on the light receiving section 2; and the color filter 20 is formed on the light receiving section 3.

On regions other than the regions where the color filters 18, 19 and 20 are formed, except regions where the light shielding metal 7, a scribing line 10 and an opening pad section 6 are provided, the three kinds of the color filters 18, 19, and 20 are formed so as to overlap each other and serve as a light shielding film. Moreover, the formation of the color filters 18, 19, and 20 causes pattern edge surfaces 9 of the interference filter 8 to be covered.

The N⁻ epitaxial layer 11 here is designed to have a thickness in consideration of reducing photodiode sensitivity of infrared light. Accordingly, it is preferable that the N⁻ epitaxial layer 11 has a thickness of approximately 3 μm to 8 μm and a specific resistance of approximately 30 Ωcm to 120 Ωcm.

The interference filter 8 is arranged by laminating a material having a high refraction index and a material having a low refraction index. The interference filter 8 uses a titanium dioxide film as a material having a high refraction index and a silicon oxide film as a material having a low refraction index. This makes it possible to form an interference filter 8 that transmits visible light and infrared light having a wavelength of 1.1 μm or more.

The color filter 18 can transmit red light and infrared light. The color filter 19 can transmit green light in a visible light region. Moreover, the color filter 20 can transmit blue light and ultraviolet light.

Light incident on the silicon oxide film 17 is absorbed according to the calculating formula below.

$$I = I_0 \times [1 - \exp(-\alpha x)]$$

($I_0$: an amount of incident light on a surface, α: absorption coefficient, and x: a distance from the surface)

Here, the absorption coefficient α varies depending on a wavelength of the incident light. Accordingly, the longer the wavelength becomes, the smaller the absorption coefficient α becomes. In other words, the longer the wavelength becomes, the deeper the position where the incident light is absorbed into the silicon becomes.

The N⁺ substrate 12 has a sufficiently high impurity concentration, and so a lifetime of an optical carrier becomes short. An optical carrier generated due to the light absorbed by the N⁺ substrate 12 cannot reach a junction. Consequently, the optical carrier cannot contribute to a photoelectric current.

In other words, a thickness of the N⁻ epitaxial layer 11 is set so that: the photodiodes PD1, PD2, and PD3 respectively have peak wavelengths of approximately 500 nm to 600 nm; and the photodiodes PD1, PD2, and PD3 have a sensitivity of infrared light having a wavelength equal to 1.1 μm or more, which sensitivity is 15% or less of that of green light having a wavelength of 550 nm.

As mentioned above, the P-type anode layer 30 is composed of the frame-like periphery section 14 and the center region 15.

Here, a diffusion depth of the center region 15 is set to a junction depth suitable for photoelectric conversion of visible light. Moreover, a diffusion depth of the frame-like periphery section 14 is set in consideration of reducing cross talk among the photodiodes PD1, PD2, and PD3, namely, reducing influence of a sneak current. Accordingly, it is preferable that (i) the frame-like periphery section 14 has a diffusion depth of approximately 1 μm and (ii) the center region 15 has a diffusion depth of approximately 0.5 μm.

Figure 3A:
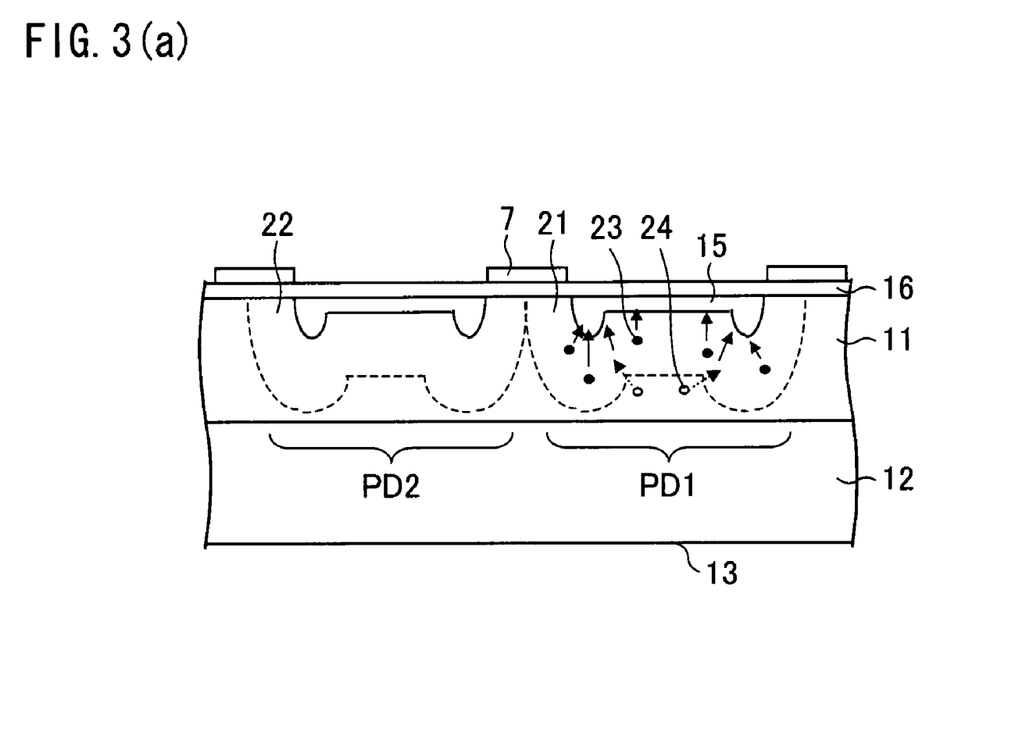
Figure 3B:
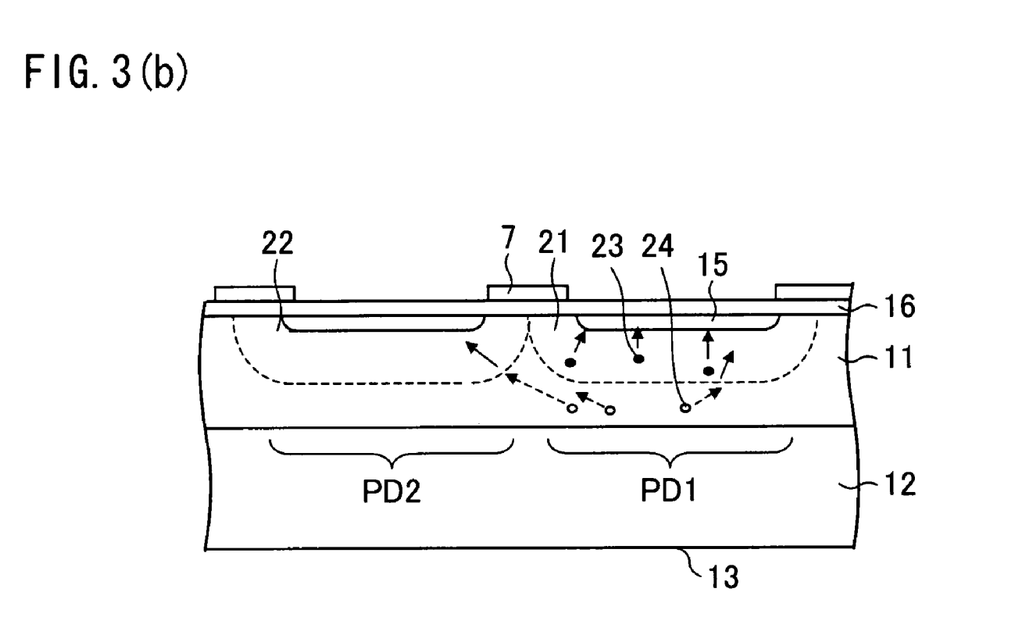

Next explained, with reference to FIGS. 3(a) and 3(b) is a difference between a sneak current in a case where a depletion layer is thick and a sneak current in a case where a depletion layer is thin.

FIG. 3(a) is a diagram illustrating a case where the depletion layer is arranged to be thick in order to suppress influence of noise on the color sensor, which noise is produced by the sneak current.

FIG. 3(b) is a diagram illustrating a case where the color sensor is influenced by noise produced by the sneak current due to the thin depletion layer.

As illustrated in FIG. 3(b), for example, when light enters the photodiode PD1, optical carriers 23 and 24 generated in the N⁻ epitaxial layer 11 contribute to a photoelectric current. The optical carriers 23 are generated in a depletion layer 21, whereas the optical carriers 24 are generated outside the depletion layer 21.

The optical carriers 23 generated in the depletion layer 21 are, due to an electric field in the depletion layer 21 of photodiode PD1, moved to the P-type anode layers 30. However, the optical carriers 24 generated outside the depletion layer 21 move in all directions. Some of the optical carriers 24 are caught in the depletion layer 22 which extends from another photodiode, for example, the photodiode PD2. The optical carriers 24 thus caught are, due to an electric voltage in the depletion layer 22 of the photodiode PD2, moved to another P-type anode layer 30.

The photoelectric current generated by such optical carriers 24 is the sneak current. This sneak current is not generated by the light that has actually entered, for example, the photodiode PD2, thereby causing a noise component. Therefore, this sneak current should be reduced.

On the other hand, in an arrangement illustrated in FIG. 3(a) according to the present embodiment, in consideration of the N⁻ epitaxial layer 11 having a thickness of 3 μm to 8 μm, (i) the specific resistance of the N⁻ epitaxial layer 11 is set to approximately 30 Ωcm to 120 Ωcm and (ii) the diffusion depth of the frame-like periphery section 14 is set to approximately 1 μm, even when a reverse bias of 1V or less is applied.

This allows optical carriers 24 generated outside the depletion layer 21 to be also caught in the depletion layer 21 extending from the frame-like periphery section 14, and then to be moved, due to the electric field of the depletion layer 21 in the photodiode PD1, to the anode layer 30 of the photodiode PD1. In other words, it becomes possible to reduce the sneak current that causes a noise component.

Moreover, the larger a reverse bias applied to each of the photodiodes PD1, PD2, and PD3 becomes, the more widely the depletion layers 21 and 22 extend. However, as to a color sensor, it is necessary to assume a case where a very low reverse bias is applied.

In the arrangement mentioned above, when light enters a color sensor of the present embodiment, (i) in the photodiode PD1, a photoelectric conversion is carried out with respect to only red light and a resultant photoelectric current is outputted, (ii) in the photodiode PD2, a photoelectric conversion is carried out with respect to only green light and a resultant photoelectric current is outputted, and (iii) in the photodiode PD3, a photoelectric conversion is carried out with respect to only blue light and a resultant photoelectric current is outputted.

Next, explained with reference to FIG. 2 is a production method of a color sensor of the present embodiment.

As illustrated in FIG. 2, first, a silicon epitaxial wafer in which an N⁻ epitaxial layer 11 is formed on an N⁺ substrate 12 by using an epitaxial growth is subjected to thermal oxidation, so that a silicon oxide film 16 is caused to be grown.

Next, the silicon oxide film 16 is removed from required parts. Then, a frame-like periphery section 14 of a P-type anode layer 30 is formed by thermal diffusion of a P-type impurity such as boron.

Because this process is accompanied by thermal oxidation, the silicon oxide film 16 is again formed on an entire surface of the epitaxial wafer. Following this process, the silicon oxide film 16 is removed from the required parts, and a thin silicon oxide film is grown. Then, a P-type impurity such as boron is implanted onto the surface of the epitaxial wafer through the oxide film by ion implantation. This allows the P-type impurity to be implanted, via the oxide film, with respect only to the parts where the oxide film is thin.

Next, a silicon oxide film is grown by using a CVD and further thermal processing is carried out so that a center region 15 of the anode layer is formed. At this time, again the silicon oxide film 16 is formed on the entire surface of the epitaxial wafer.

A subsequent process removes the silicon oxide film 16 at an anode contact opening section 4 of a metal electrode 5 and a scribing line 10. Then, a metal electrode 5 and a light shielding metal 7 are formed by depositing an electric material such as aluminum and subjecting the deposited electric material to patterning.

On the epitaxial wafer after the above-mentioned process, a silicon oxide film 17 is grown on an entire surface of the epitaxial wafer by using a CVD. Then, an electric material such as Au is deposited on a back surface of the epitaxial wafer and the epitaxial wafer is subjected to thermal processing. As a result, a cathode electrode 13 is formed.

After the formation of the cathode electrode 13, a silicon oxide film and a titanium dioxide film are formed in an alternating manner by a sputtering method or the like on the surface of the epitaxial wafer, in order to form the interference filter 8. At this time, the parts that should not be covered by the films are masked with a metal material.

Next, a color filter 18 is formed by applying a photosensitive resin that contains a pigment, (ii) carrying out patterning by photolithography, and (iii) carrying out thermal treatment after the patterning. As with the color filter 18, a color filter 19 is formed. Similarly, a color filter 20 is formed.

Here, a developer used for patterning the color filters 18, 19 and 20 may corrode a pattern edge surface 9 of the interference filter 8. Accordingly, it is necessary to arrange such that the color filters 18, 19, and 20 cover the pattern edge surface 9 of the interference filter 8.

It is necessary to cover the pattern edge surface 9 with at least one color filter of the color filters 18, 19 and 20, the one color filter being formed first. In the present embodiment, the pattern edge surface 9 is covered by all of the three color filters 18, 19, and 20.

After the formation of the color filters 18, 19, and 20, the silicon oxide film 17 is removed at a pad opening section 6 of the metal electrode 5. The electrode material such as aluminum may be corroded by the developer used in the patterning of each of the color filters 18, 19, and 20. Because the silicon oxide film 17 functions as a protective film against the developer, the silicon oxide film 17 should be removed after the formation of the color filters 18, 19, and 20.

According to the processes mentioned above, the color sensor of the present embodiment is produced. This color sensor of the present embodiment can be applied to a sensor and an electronics device. This makes it possible to provide a sensor which has (i) less noise caused by infrared light, (ii) sufficient resistance to mechanical and thermal stresses, and (iii) excellent reliability. Moreover, a size and a thickness of the color sensor can be easily reduced. Accordingly, with the color sensor, it is possible to provide an electronics device whose system can be reduced in size.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below. Moreover, a combination of the above-explained limits can realize one chip with a plurality of color identifying elements without property deterioration. This makes it possible to provide a color sensor which is small in size and low in price. However, what priority is given to varies depending on the applications of the color sensor. What priority is given to is, for example, price, reduction in infrared sensitivity, reduction in cross talk, reduction in capacity, or the like. Accordingly, it is preferable to appropriately change the limits mentioned above according to the application of the color sensor.

As mentioned above, according to one embodiment of the present invention, a color sensor including: a plurality of color filters, provided side by side, transmitting incident light; and light receiving elements, respectively corresponding to the color filters, each converting the incident light into an electrical signal, the color sensor further includes: an interference filter, provided directly above the light receiving elements, transmitting light having a predetermined wavelength of the incident light; and the color filters being provided directly on the interference filter.

According to this arrangement, the interference filter is provided adjacent to the color filter. Accordingly, immediately after light passes through the color filter, the light passes through the interference filter. This makes it possible to prevent a photoelectric current, which is caused by incoming near infrared light and infrared light and interferes with color analysis. As a result, it becomes possible to carry out a precise color analysis of incoming light, which color analysis is carried out with less noise component caused by the near infrared light.

As a result, this makes it possible to provide a color sensor which is capable of preventing a photoelectric current caused by near infrared light and infrared light and carrying out a precise color analysis.

According to one embodiment of the present invention, a color sensor including: a plurality of color filters, provided side by side, transmitting incident light; and light receiving elements, respectively corresponding to the color filters, each converting the incident light into an electrical signal, the color sensor further includes: an interference filter, provided directly on the color filters, transmitting light having a predetermined wavelength of the incident light; and the color filters being provided directly above the light receiving element.

According to this arrangement, the color filter is provided adjacent to the interference filter. Accordingly, immediately after light passes through the interference filter, the light passes through the color filter. This makes it possible to prevent a photoelectric current which is caused by incoming near infrared light and interferes with color analysis. As a result, it becomes possible to carry out a precise color analysis of incoming light, which color analysis is carried out with less noise component caused by the near infrared light.

As a result, this makes it possible to provide a color sensor which is capable of preventing a photoelectric current caused by near infrared light and carrying out a precise color analysis.

It is preferable that the interference filter is composed of a material having a high refraction index and a material having a low refraction index laminated in an alternating manner.

This makes it possible to guide a plurality of lights having respectively different wavelengths into different light paths to extract only light having a desired wavelength by means of the interference filter.

It is preferable that the color filters cover edge surfaces of the interference filter.

This makes it possible to prevent corrosion of a pattern edge surface of the interference filter, which corrosion may be caused by a developer used in the patterning of the color filters.

It is preferable that the interference filter includes a visible-light infrared-light transmitting filter that transmits visible light and infrared light having a wavelength of equal to or more than 1 μm.

A photodiode generally used is very sensitive to near infrared light having a wavelength in a range from 700 nm to 900 nm. Accordingly, reduction of noise due to the infrared light is possible by causing a light receiving element to receive light having a wavelength that is outside the above peak wavelength range.

It is preferable that the interference filter includes a visible-light infrared-light transmitting filter that transmits visible light and infrared light having a wavelength of equal to or more than 1.1 μm; and sensitivity of the light receiving element to infrared light having a wavelength of equal to or more than 1.1 μm is 15% or less of sensitivity of the light receiving element to green light having a wavelength of 550 nm.

This makes it possible to reduce noise caused by the infrared light as compared with a case using an infrared transmitting interference filter that transmits infrared light having a wavelength equal to 1 μm or more. It is preferable that a photoelectric current caused by the light having a wavelength of 1 μm or more is suppressed to be equal to or less than a dark current. Such an arrangement particularly can suppress increase in capacity or cost. The arrangement can also reduce noise caused by near infrared light.

It is preferable that a titanium dioxide film is used as the material having a high refraction index, and a silicon dioxide film is used as the material having a low refraction index.

Relatively, the titanium dioxide film and the silicon dioxide film are materials that are available with relatively ease. With these substances, it is possible to form the material having a high refraction index and the material having a low refraction index at low cost.

It is preferable that each of the color filters is formed with a photosensitive resin containing a pigment.

This makes it possible to form a fine pattern at low cost.

In the color sensor of one embodiment of the present invention, it is preferable that a light shielding film includes at least two kinds of the color filters overlapped.

In this arrangement, by forming the light shielding film, it is possible to suppress interference from the light entering an adjacent light receiving element. Moreover, because this arrangement eliminates the need for formation of a special film as a light shielding film, it is possible to reduce cost of a material and process for formation of the light shielding film.

It is preferable that the light receiving elements are photodiodes each comprising a first conductive semiconductor substrate, a first conductive layer formed on the first conductive semiconductor substrate, and a second conductive layer formed on the first conductive layer; and a peak wavelength of the photodiode with respect to infrared light is equal to or less than 800 nm.

Although a silicon photodiode is generally used as a light receiving element, a peak wavelength of the silicon photodiode is approximately in a range from 850 nm to 950 nm. Accordingly, the silicon photodiode is very sensitive to infrared light among incoming lights. This becomes a cause of noise. However, with the use of a photodiode having a peak wavelength equal to 800 nm or less, it becomes possible to reduce infrared light entering the light receiving element.

It is preferable that the first conductive semiconductor substrate is formed in a silicon epitaxial wafer; and on the first conductive semiconductor substrate is formed an epitaxial layer including the second conductive layer, which epitaxial layer has a thickness in a range from 1 μm to 10 μm.

As in the arrangement mentioned above, by arranging the thickness of the epitaxial layer equal to 10 μm or less, it is possible to reduce sensitivity of the photodiode to the infrared light. Namely, when light enters silicon, light (infrared light) having a long wavelength is absorbed at a deeper position below the surface of silicon, compared with light having a short wavelength, and generates an optical carrier. Unless the optical carrier generated reaches a PN junction, the optical carrier cannot contribute to a photoelectric current.

Here, with the use of a silicon epitaxial wafer in which, for example, an $N^-$ epitaxial layer as a first conductive layer having a low impurity concentration is formed on, for example, an $N^+$ substrate as a first conductive semiconductor substrate having a high impurity concentration, a photodiode is obtained in which a P-type layer is formed below the surface of the $N^-$ epitaxial layer.

When the impurity concentration is high, the optical carrier generated soon disappears. Accordingly, when light enters this photodiode, the optical carrier generated in the $N^+$ substrate cannot contribute to a photoelectric current because, for example, the optical carrier cannot reach the PN junction.

Reduction of a thickness of the $N^-$ epitaxial layer increases optical carriers generated in the $N^+$ substrate, in other words, the optical carriers that do not contribute to a photoelectric current. This deteriorates photosensitivity of the photodiode. However, the photosensitivity of the photodiode drastically deteriorates with respect to long wavelength light, namely, infrared light that produces optical carriers at a deeper position below the surface of the photodiode.

In this way, with the use of a silicon epitaxial wafer including a thin epitaxial layer, it is possible to reduce the sensitivity of the photodiode to infrared light.

Moreover, a small capacity can be realized by arranging the thickness of the epitaxial layer to be 1 μm or more. In addition, wafer cost also can be suppressed to low cost.

In the color sensor of one embodiment of the present invention, it is preferable that the photodiodes are a first photodiode, a second photodiode, and a third photodiode and provided side by side; and a color filter transmitting red light in a visible light region is formed for the first photodiode; a color filter transmitting green light in the visible light region is formed for the second photodiode; and a color filter transmitting the blue light in the visible light region is formed for the third photodiode.

According to this arrangement, when visible light enters the above-mentioned color sensor, the first photodiode receives only red light. The second photodiode receives only green light. The third photodiode receives only blue light. This makes it possible to obtain signals respectively indicating red, green and blue light intensities from the visible light.

In the color sensor of one embodiment of the present invention, it is preferable that the second conductive layer has a center region and a frame-like periphery section that is formed so as to be deeper than the center region.

The optical carriers that are generated in the N⁻ epitaxial layer move in all directions outside the depletion layer, in other words, in an electric voltage free region. Accordingly, some of the optical carriers generated by the light that has entered an adjacent photodiode may enter a photodiode. This is generally called cross talk. The cross talk means a phenomenon where a photoelectric current runs in the photodiode in which light has not actually entered.

In order to prevent the cross talk, the frame-like periphery section which is a periphery section of the above-mentioned second conductive layer is arranged to be relatively deeper than the center region. In other words, the depletion region is arranged to come close to the N⁺ layer. This makes it possible to prevent, by an electric field in the depletion layer, the optical carriers generated outside the depletion layer from spreading into a neighboring region.

In the color sensor of one embodiment of the present invention, it is preferable that the frame-like periphery section of the second conductive layer has a depth of equal to or more than 0.8 μm below a surface of the second conductive layer, and the center region has a depth of less than 0.8 μm below the surface thereof. This makes it possible to prevent the cross talk more effectively.

In the color sensor of one embodiment of the present invention, it is preferable further that a specific resistance of the epitaxial layer is 20 Ωcm to 200 Ωcm.

Generally decrease in impurity concentration increases a specific resistance. Accordingly, by arranging the specific resistance of the epitaxial layer to be 20 Ωcm or more, a depth of the depletion layer becomes deeper. This makes it possible to further reduce the cross talk. Moreover, by arranging the specific resistance of the epitaxial layer to be 200 Ωcm or less, wafer cost can be suppressed even in a case where the thickness of the epitaxial layer is arranged to be 10 μm or less. Therefore, this makes it possible to provide a wafer more suitable for mass production.

According to one embodiment of the present invention, in a production method of a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter, a silicon oxide film is formed on a metal section of the light receiving element before formation of the interference filter.

This makes it possible to prevent corrosion of an electrode material such as aluminum, which corrosion may be caused by a developer or the like used in patterning the color filters.

In the production method of the color sensor, it is preferable that the silicon oxide film formed on the metal section is removed after formation of the color filters.

This makes it possible to excellently form a metal electrode and a light shielding metal by depositing an electrode material such as aluminum.

A sensor of one embodiment of the present invention includes a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter.

An electronics device of one embodiment of the present invention includes a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter.

This makes it possible to provide a sensor and an electronics device that can prevent a photoelectric current caused by near infrared light and infrared light and carry out a precise color analysis.

According to the present invention, an interference filter is provided directly above the light receiving element so as to transmit incoming light having a predetermined wavelength of the incoming light, and, moreover, directly on this interference filter, a plurality of color filters are provided side by side. Alternatively, a plurality of the color filters are provided side by side directly above the light receiving element and, moreover, the interference filter is provided directly on the plurality of the color filters. This arrangement makes it possible to prevent a photoelectric current caused by incoming near infrared light, which photoelectric current interferes with the color analysis. This makes it possible to perform a precise color analysis of incoming light with less noise component caused by near infrared light. Therefore, the present invention can be extensively applied not only to color sensors and production of color sensors but also to various optical sensors.

What is claimed is:

1. A color sensor comprising:
a plurality of color filters, provided side by side, transmitting incident light; and
light receiving elements, respectively corresponding to the color filters, each converting the incident light into an electrical signal,
the color sensor further comprising:
an interference filter, provided directly above the light receiving elements, transmitting light having a predetermined wavelength of the incident light; and
the color filters being provided directly on the interference filter,
the light receiving elements being a plurality of photodiodes each formed by (i) producing a first conductive silicon epitaxial wafer by forming an epitaxial layer with a use of an epitaxial growth and (ii) forming a second conductive layer from a surface of the epitaxial layer of the silicon epitaxial wafer into the epitaxial layer,
the second conductive layer having a center region and a frame-like periphery section that is formed so as to be deeper than the center region.

2. The color sensor as set forth in claim 1, wherein:
a peak wavelength of the photodiode with respect to infrared light is equal to or less than 800 nm.

3. The color sensor as set forth in claim 2, wherein:
on the first conductive silicon epitaxial wafer is formed the epitaxial layer having a thickness in a range from 1 μm to 10 μm.

4. The color sensor as set forth in claim 2, wherein:
the light receiving elements being a first photodiode, a second photodiode, and a third photodiode which are the plurality of photodiodes and which are provided side by side; and
a color filter transmitting red light in a visible light region is formed for the first photodiode; a color filter transmitting green light in the visible light region is formed for the second photodiode; and a color filter transmitting the blue light in the visible light region is formed for the third photodiode.

5. The color sensor as set forth in claim 1, wherein the frame-like periphery section of the second conductive layer has a depth of equal to or more than 0.8 μm below a surface of the second conductive layer, and the center region has a depth of less than 0.8 μm below the surface thereof.

6. The color sensor as set forth in claim 3, wherein a specific resistance of the epitaxial layer is 20 Ωcm to 200 Ωcm.

7. A sensor comprising a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter, the light receiving elements being a plurality of photodiodes each formed by (i) producing a first conductive silicon epitaxial wafer by forming an epitaxial layer with a use of an epitaxial growth and (ii) forming a second conductive layer from a surface of the epitaxial layer of the silicon epitaxial wafer into the epitaxial layer, the second conductive layer having a center region and a frame-like periphery section that is formed so as to be deeper than the center region.

8. An electronics device comprising a color sensor including: a plurality of color filters, provided side by side, transmitting incident light; light receiving elements, respectively corresponding to the color filters, each converting the incident light into an electrical signal; and an interference filter, provided directly above the light receiving elements, transmitting light having a predetermined wavelength of the incident light, the color filters being provided directly on the interference filter, the light receiving elements being a plurality of photodiodes each formed by (i) producing a first conductive silicon epitaxial wafer by forming an epitaxial layer with a use of an epitaxial growth and (ii) forming a second conductive layer from a surface of the epitaxial layer of the silicon epitaxial wafer into the epitaxial layer, the second conductive layer having a center region and a frame-like periphery section that is formed so as to be deeper than the center region.

* * * * *